United States Patent
Wang et al.

(10) Patent No.: US 9,389,653 B2
(45) Date of Patent: Jul. 12, 2016

(54) MOUNTING APPARATUS FOR STORAGE DEVICE

(71) Applicant: ENNOCONN CORPORATION, New Taipei (TW)

(72) Inventors: Kun-Ming Wang, New Taipei (TW); Shih-Chi Liu, New Taipei (TW)

(73) Assignee: ENNOCONN CORPORATION, New Taipei (TW)

( * ) Notice: Subject to any disclaimer, the term of this patent is extended or adjusted under 35 U.S.C. 154(b) by 25 days.

(21) Appl. No.: 14/575,282

(22) Filed: Dec. 18, 2014

(65) Prior Publication Data

US 2016/0124471 A1 May 5, 2016

(30) Foreign Application Priority Data

Oct. 31, 2014 (TW) .............................. 103137707 A

(51) Int. Cl.
*G06F 1/18* (2006.01)
*H05K 7/14* (2006.01)

(52) U.S. Cl.
CPC ................ *G06F 1/187* (2013.01); *G06F 1/182* (2013.01); *H05K 7/1417* (2013.01)

(58) Field of Classification Search
CPC ........... H01R 4/66; G06F 1/187; G06F 1/182; G11B 33/124; G11B 33/128
USPC ...................................................... 361/679.33
See application file for complete search history.

(56) References Cited

U.S. PATENT DOCUMENTS

| | | | |
|---|---|---|---|
| 6,652,314 B2 * | 11/2003 | Tournadre | H01R 4/64 439/536 |
| 7,495,904 B2 * | 2/2009 | Liang | G06F 1/187 361/679.39 |
| 7,701,707 B2 * | 4/2010 | Peng | G11B 33/128 248/618 |
| 2004/0105229 A1 * | 6/2004 | Wang | G06F 1/187 361/679.33 |
| 2007/0030639 A1 * | 2/2007 | Ko | G11B 33/1493 361/679.34 |
| 2008/0089021 A1 * | 4/2008 | Deng | G06F 1/187 361/679.39 |
| 2008/0157638 A1 * | 7/2008 | Liu | G11B 33/124 312/223.2 |
| 2008/0158810 A1 * | 7/2008 | Liu | G11B 33/124 361/679.33 |
| 2009/0059507 A1 * | 3/2009 | Peng | G11B 33/124 361/679.33 |
| 2009/0103252 A1 * | 4/2009 | Peng | G11B 33/124 361/679.4 |
| 2009/0129009 A1 * | 5/2009 | Zhang | G11B 33/12 361/679.34 |
| 2009/0141457 A1 * | 6/2009 | Fujikawa | G06F 1/187 361/727 |
| 2009/0167124 A1 * | 7/2009 | Lee | G06F 1/187 312/223.2 |
| 2010/0187957 A1 * | 7/2010 | Liang | G06F 1/187 312/223.2 |
| 2011/0128696 A1 * | 6/2011 | Weng | G11B 33/08 361/679.35 |

* cited by examiner

Primary Examiner — Adrian S Wilson
(74) Attorney, Agent, or Firm — ScienBiziP, P.C.

(57) ABSTRACT

A mounting apparatus for selectively mounting a first storage device or a second storage device in a storage rack includes a supporting frame made of a resilient material. The supporting frame includes two side brackets. Each side bracket includes a sidewall, an upper wall, a lower wall opposite to the upper wall, and a deformable abutting member formed at the upper wall. The lower walls and the upper walls of the side brackets are capable of sandwiching two opposite portions of the first storage device. When the abutting members are bent below the corresponding upper walls, the lower walls and the abutting members of the side brackets are capable of sandwiching two opposite portions of the second storage device.

15 Claims, 10 Drawing Sheets

MOUNTING APPARATUS FOR STORAGE DEVICE

FIELD

The subject matter herein generally relates to a mounting apparatus for storage devices.

BACKGROUND

An electronic device, such as a server, may be required to house storage devices with different sizes, such as 3.5 inch hard disk drives and 2.5 inch hard disk drives.

BRIEF DESCRIPTION OF THE DRAWINGS

Implementations of the present technology will now be described, by way of example only, with reference to the attached figures.

DETAILED DESCRIPTION

Figure 1:
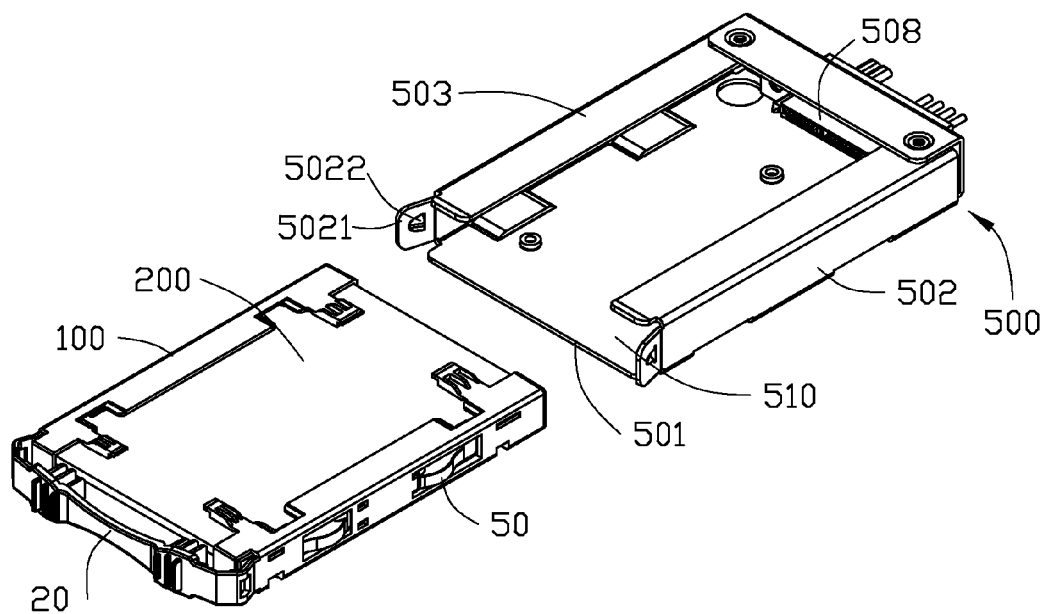
FIG. 1 is an exploded, isometric view of an embodiment of a mounting apparatus with a first storage device and a storage rack.
Figure 2:
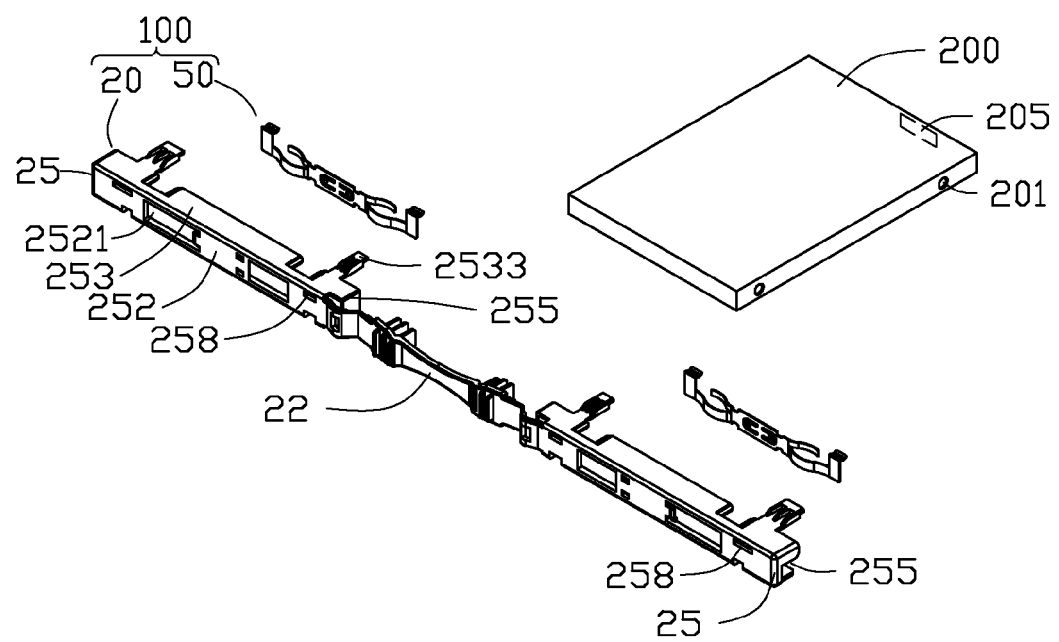
FIG. 2 is an exploded, isometric view of the mounting apparatus and the first storage device of FIG. 1.
Figure 3:
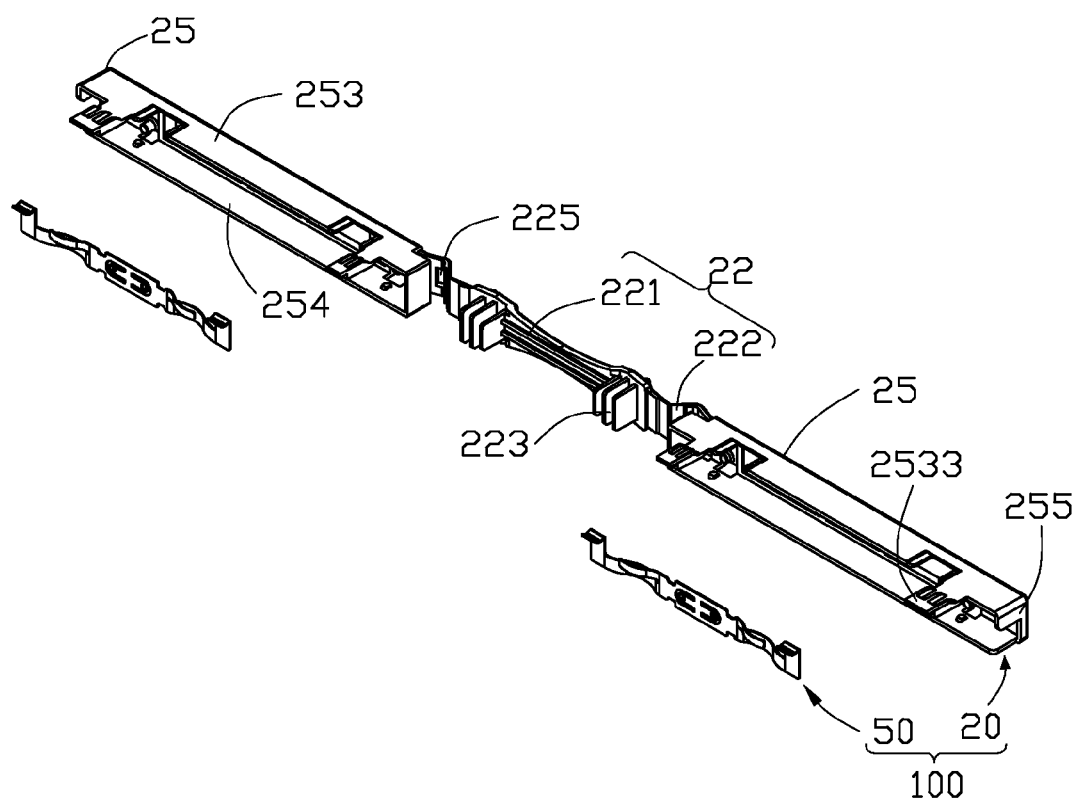
FIG. 3 is an isometric view of the mounting apparatus of FIG. 2, but viewed from another angle, wherein the mounting apparatus includes two grounding members.
Figure 4:
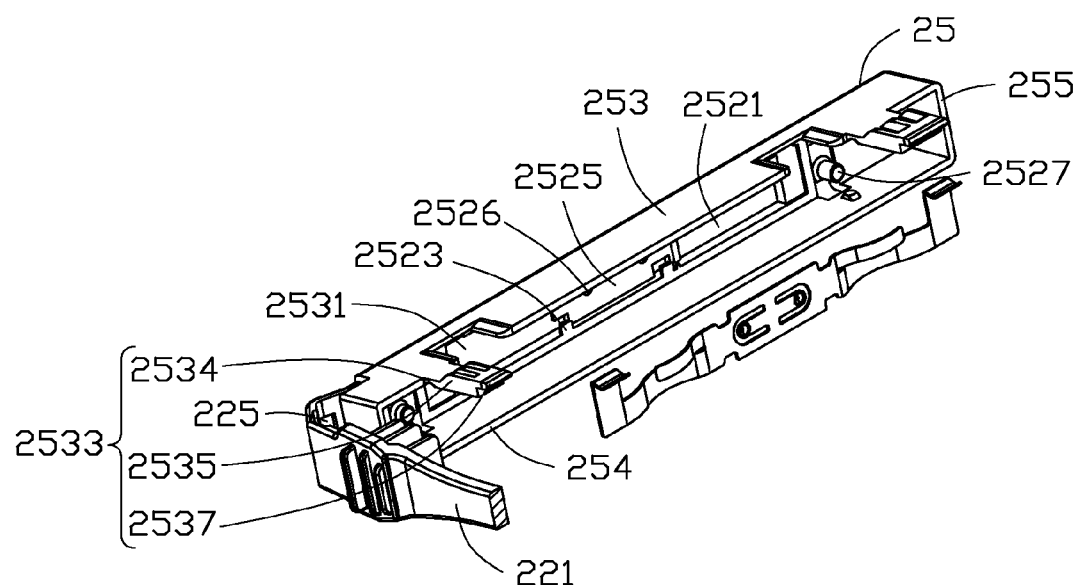
FIG. 4 is a partial isometric view of FIG. 3, but viewed from another angle.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to a mounting apparatus.

Figure 9:
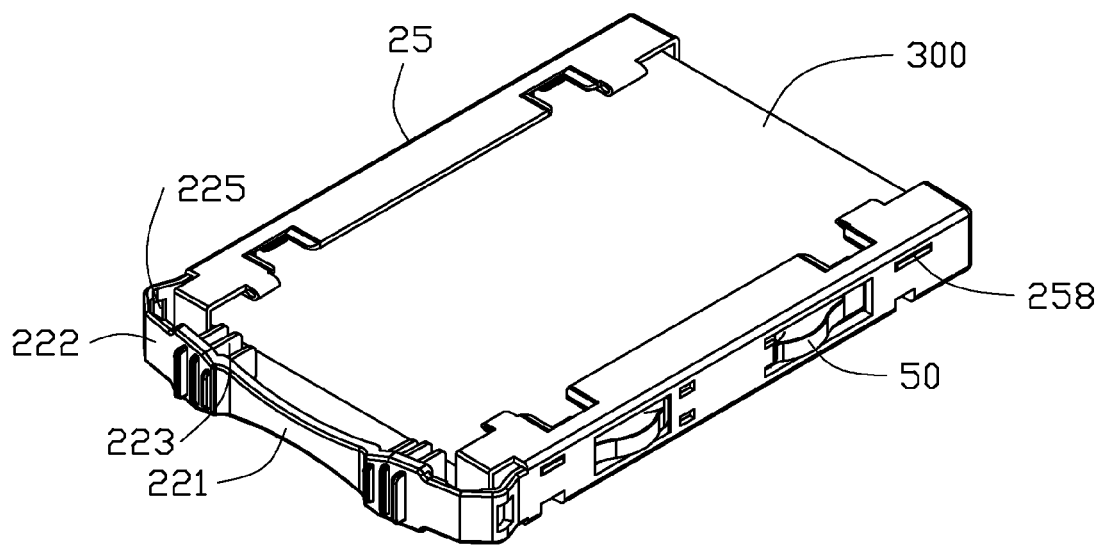
FIG. 9 is an assembled, isometric view of FIG. 7.
Figure 10:
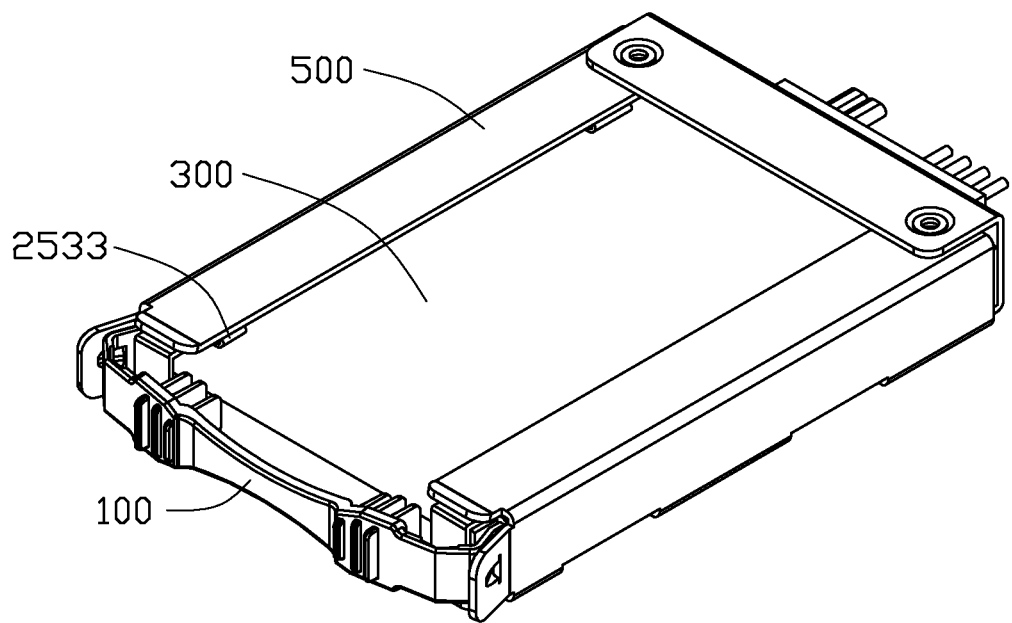
FIG. 10 is an assembled, isometric view of the mounting apparatus, the second storage device, and the storage rack.

FIGS. 1-4 illustrate an embodiment of a mounting apparatus 100 provided for selectively fixing a first storage device 200 or a second storage device 300 (shown as FIG. 9) to a storage rack 500. The mounting apparatus 100 comprises a supporting frame 20 and two grounding members 50.

The second storage device 300 is similar to the first storage device 200, but a thickness of the second storage device 300 is less than a thickness of the first storage device 200. Two fixing holes 201 are defined in each of two opposite sides of the first storage device 200. Two fixing holes 301 are defined in each of two opposite sides of the second storage device 300. The first storage device 200 comprises a connector 205 located at a rear end of the first storage device 200. The second storage device 300 comprises a connector 305 located at a rear end of the second storage device 300. In the embodiment, the first storage device 200 is a 9 mm thickness hard disk drive, and the second storage device 300 is a 7 mm thickness hard disk drive.

The supporting frame 20 is made of elastic material, such as plastic or nylon, and comprises a handle 22 and two side brackets 25 extending from two opposite ends of the handle 22. The side brackets 25 can be aligned in a line with the handle 22 when the supporting frame 20 is in an original state. Therefore, the supporting frame 20 can be compactly stored to save space during transportation.

Each side bracket 25 comprises a sidewall 252, an upper wall 253 extending substantially perpendicular from a top side of the sidewall 252, and a lower wall 254 extending substantially perpendicular from a bottom side of the sidewall 252 in a same direction with the upper wall 253. In addition, each side bracket 25 comprises two end walls 255 extending from opposite ends of the sidewall 252 and connected between corresponding ends of the upper and lower walls 253 and 254. A distance between inside surfaces of the upper and lower walls 253 and 254 of each side bracket 25 is slightly less than a height of the first storage device 200 and a height of the second storage device 300. A distance between inside surfaces of the end walls 255 of each side bracket 25 is slightly less than a length of the first storage device 200 and a length of the second storage device 300.

Two end portions of each sidewall 252 define two through holes 2521. Two pairs of latching pieces 2523 are formed inside each sidewall 252. The latching pieces 2523 are parallel to the sidewall 252, and the latching pieces 2523 and the sidewall 252 cooperatively bound a mounting slot 2525. A middle of the inside surface of each sidewall 252 defines two positioning holes 2526 positioned between the latching pieces 2523. Two positioning pins 2527 extend from two opposite ends of the inside surface of the sidewall 252. Two opposite ends of a side of each upper wall 253 away from the corresponding sidewall 252 respectively define a cutout 2531. Two abutting members 2533 extend out from the two opposite ends of the side of each upper wall 253, adjacent to the corresponding cutouts 2531. Each abutting member 2533 comprises a resilient coupling piece 2534 extending from the corresponding upper wall 253, an abutting block 2535 protruding from a distal end of the coupling piece 2534, and a latching block 2537 protruding from a distal end of the abutting block 2535 opposite to the coupling piece 2534. Each sidewall 252 defines two latching holes 258 corresponding to the abutting members 2533.

The handle 22 comprises a grip 221, and two substantially arc-shaped connection portions 222 extending from opposite ends of the grip 221 and connected to the corresponding side brackets 25. A plurality of abutting pieces 223 is formed on the inside surface of the grip 221, adjacent to each of the connection portions 222. Each connection portion 222 defines a locking hole 225.

The storage rack 500 comprises a bottom plate 501, two side plates 502 extending substantially perpendicular up from opposite sides of the bottom plate 501, and two top plates 503 extending substantially perpendicular from tops of the side plates 502 towards each other. The storage rack 500 defines an access 510 in a front end of the storage rack 500. A locking portion 5021 extends from a front end of each of the side plates 502 slantingly away from the other side plate 502. A protrusion 5022 protrudes inwards from each of the locking portions 5021. The storage rack 500 is made of conducting material. A plug 508 is mounted at an end of the storage rack 500, away from the access 510.

Figure 5:
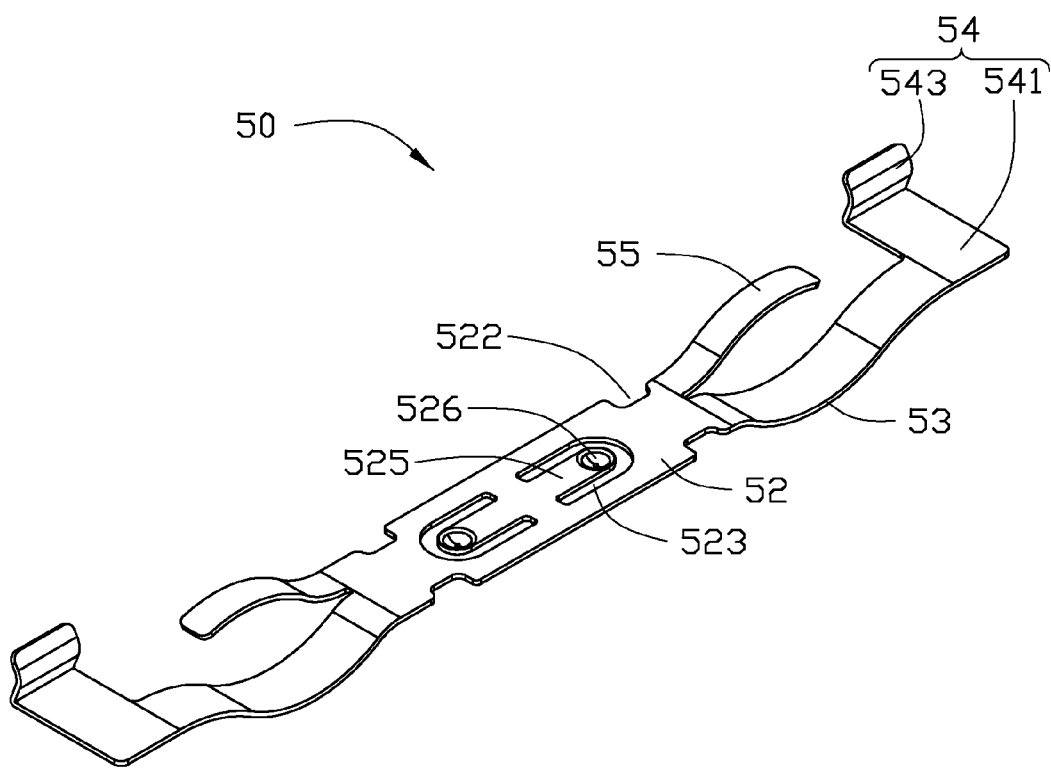
FIG. 5 is an isometric view of one of the grounding members of FIG. 3, but viewed from another angle.
Figure 6:
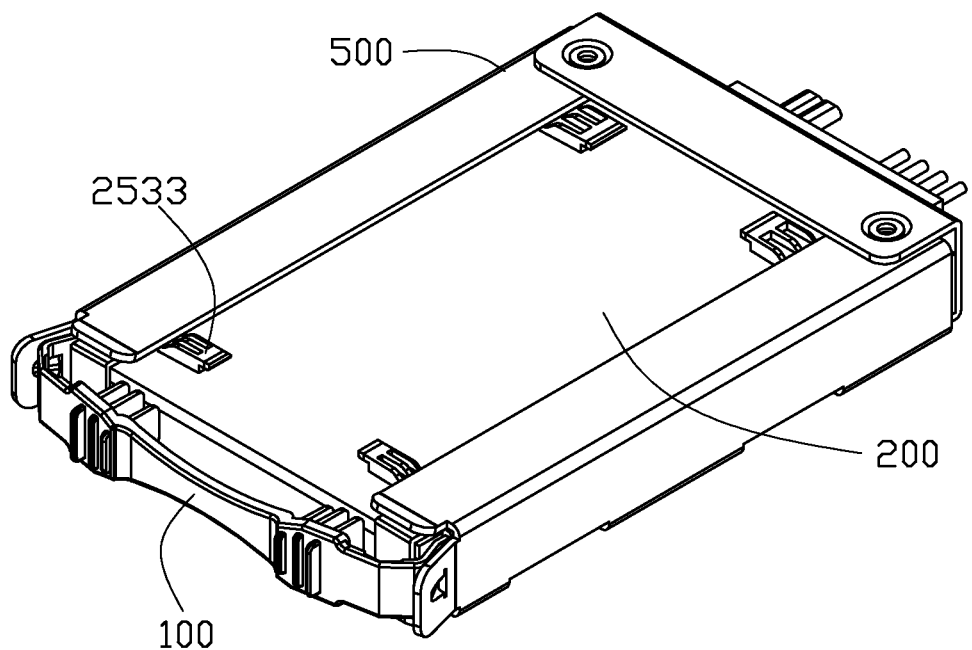
FIG. 6 is an assembled, isometric view of FIG. 1.
Figure 7:
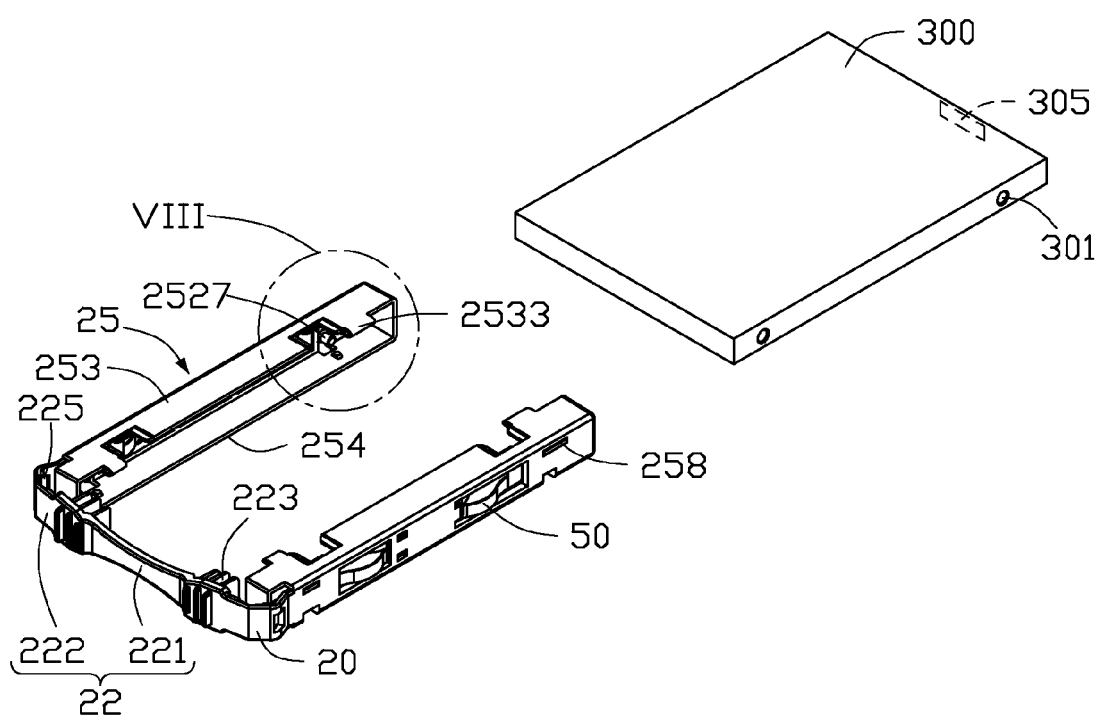
FIG. 7 is an exploded, isometric view of the mounting apparatus together with a second storage device.
Figure 8:
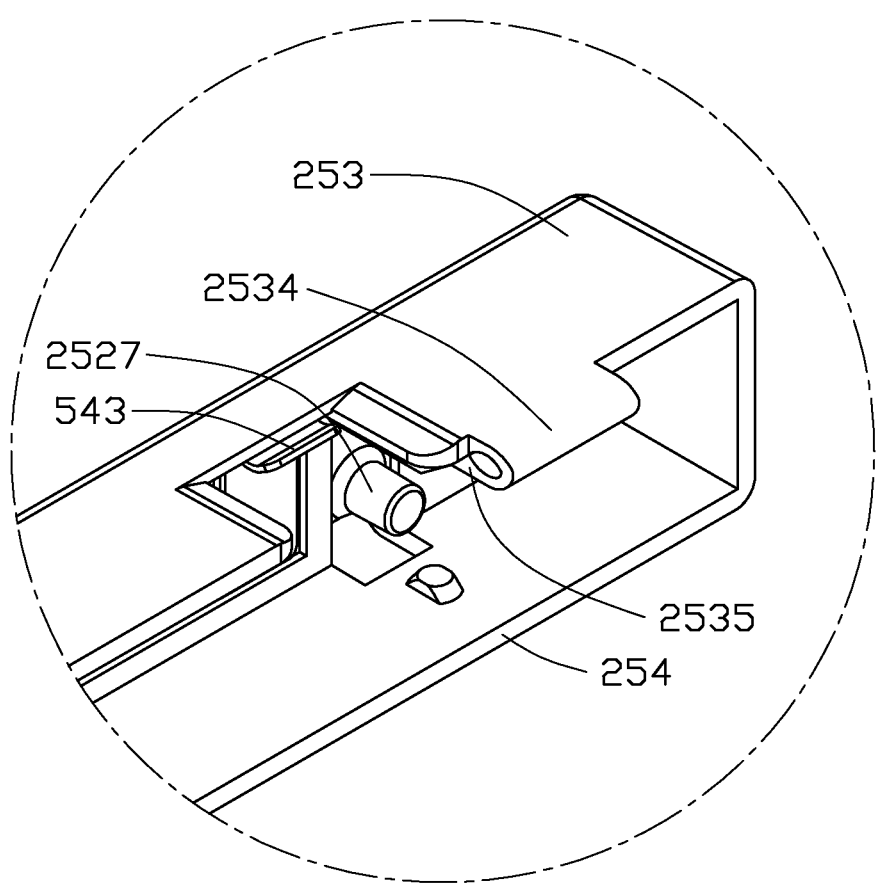
FIG. 8 is an enlarged view of a circled portion VIII of FIG. 7.

FIG. 5 illustrates one of the grounding members 50. Each grounding member 50 is made of resilient and conducting material, and comprises a substantially rectangular mounting plate 52, two substantially arc-shaped abutting plates 53 slantingly extending toward a first direction from two opposite ends of the mounting plate 52, a positioning plate 54 extending out from a distal end of each abutting plate 53, and two substantially arc-shaped connecting pieces 55 slantingly extending toward a second direction opposite to the first direction from the two opposite ends of the mounting plate 52, adjacent to the abutting plates 53. Two opposite sides of the mounting plate 52 define two pairs of cutouts 522 adjacent to the abutting plates 53 and the connecting pieces 55. The mounting plate 52 defines two receiving slots 523 extending along a lengthwise direction of the mounting plate 52. A resilient tongue 525 extends into each receiving slot 523 from an end wall bounding the receiving slot 523 adjacent to a middle portion of the mounting plate 52. A substantially hemispherical protrusion 526 protrudes from a distal end of each tongue 525 toward the first direction. Each positioning plate 54 is substantially L-shaped, and comprises a connecting portion 541 extending substantially perpendicular from the distal end of the abutting plate 53 toward the corresponding connecting piece 55 and a substantially arc-shaped position portion 543 extending from a distal end of the connecting portion 541 toward the second direction.

In assembly of the mounting apparatus 100, the grounding members 50 are received in the side brackets 25, the abutting plates 53 are extended through the corresponding through holes 2521 and exposed out of the sidewalls 252, and the position portions 543 are received in the corresponding cutouts 2531. The mounting plates 52 of the grounding members 50 are received in the mounting slots 2525 of the corresponding side brackets 25. The latching pieces 2523 extend through the corresponding cutouts 522. The grounding members 50 are slid along the mounting slots 2525. The protrusions 526 slidably abut against the inside surfaces of the sidewalls 252, deforming the tongues 525, until the protrusions 526 align with the corresponding positioning holes 2526. The tongues 525 are restored to bias the protrusions 526 to latch in the positioning holes 2526, and the mounting plates 52 are sandwiched between the sidewalls 252 and the corresponding latching pieces 2523. The connecting pieces 55 are received in the side brackets 25 and separate from the sidewalls 252.

FIGS. 1-6 illustrate to mount the first storage device 200, the supporting frame 20 is bent about the connection portions 222 to become U-shaped. The side brackets 25 are attached to the opposite sides of the first storage device 200. Parts of the first storage device 200 adjacent to the opposite sides of the first storage device 200 are received in the side brackets 25, with the positioning pins 2527 engaging in the corresponding fixing holes 201 of the first storage device 200. Because the distance between the inside surfaces of the upper and the lower walls 253 and 254 of each side bracket 25 is slightly less than the height of the first storage device 200, and the distance between the inside surfaces of the end walls 255 of each side bracket 25 is slightly less than the length of the first storage device 200. The side brackets 25 are deformed by the first storage device 200 to tightly hold the first storage device 200. The abutting pieces 223 of the handle 22 abut a front end of the first storage device 200 to keep an angle between the handle 22 and the sidewall 252 of each of the side brackets 25 greater than 90 degrees. The connecting pieces 55 of the grounding members 50 abut against the corresponding sides of the first storage device 200. The position portions 543 of the grounding members 50 abut against a top surface of the first storage device 200, and the abutting members 2533 of the side brackets 25 abut against the top surface of the first storage device 200. Therefore, the first storage device 200 is installed to the mounting apparatus 100.

The supporting frame 20 together with the first storage device 200 are slid into the storage rack 500 through the access 510 until the protrusions 5022 of the storage rack 500 engage in the locking holes 225 of the supporting frame 20. Therefore, the first storage device 200 is retained in the storage rack 500, and the connector 205 of the first storage device 200 is electrically coupled to the plug 508 of the storage rack 500. The abutting plates 53 of each grounding member 50 resiliently abut against the corresponding side plates 502 of the storage rack 500 for damping the shock to the first storage device 200. The first storage device 200 is effectively grounded to the storage rack 500 through the grounding members 50.

To detach the first storage device 200 from the storage rack 500, the grip 221 of the handle 22 is moved away from the storage rack 500 to deform the handle 22. The connection portions 222 move inward to make the locking holes 225 of the connection portions 222 disengage from the corresponding protrusions 5022 of the storage rack 500. Therefore, the mounting apparatus 100 together with the first storage device 200 is ready to be slid out of the storage rack 500 through the access 510, and the connector 205 of the first storage device 200 is disengaged from the plug 508 of the storage rack 500.

FIGS. 7-10 illustrate that to mount the second storage device 300, each abutting member 2533 is bent about the corresponding coupling piece 2534 until the latching block 2537 of the abutting member 2533 is latched in the corresponding latching hole 258. Each abutting block 2535 engages with the inside surface of the corresponding upper wall 253. A distance between the inside surface of the lower wall 254 and the corresponding abutting blocks 2535 of each side bracket 25 is slightly less than the height of the second storage device 300.

The supporting frame 20 is bent about the connection portions 222 to become U-shaped. The side brackets 25 are attached to the opposite sides of the second storage device 300. Parts of the second storage device 300 adjacent to the opposite sides of the second storage device 300 are received in the side brackets 25 with the positioning pins 2527 engaging in the corresponding fixing holes 301 of the second storage device 300. Because the distance between the inside surfaces of the lower walls 253 and the corresponding abutting blocks 2535 of each side bracket 25 is slightly less than the height of the second storage device 300, and the distance between the inside surfaces of the end walls 255 of each side bracket 25 is slightly less than the length of the second storage device 300. The side brackets 25 are deformed by the second storage device 300 to tightly hold the second storage device 300. The abutting pieces 223 of the handle 22 abut a front end of the second storage device 300 to keep an angle between the handle 22 and the sidewall 252 of each of the side brackets 25 greater than 90 degrees. The connecting pieces 55 of the grounding members 50 abut against the corresponding sides of the second storage device 300. The abutting blocks 2535 of the side brackets 25 abut against the top surface of the second storage device 300.

The supporting frame 20 together with the second storage device 300 are slid into the storage rack 500 through the access 510, until the protrusions 5022 of the storage rack 500 engage in the locking holes 225 of the supporting frame 20. Therefore, the second storage device 300 is retained in the storage rack 500, and the connector 305 of the second storage device 300 is electrically coupled to the plug 508 of the storage rack 500. The abutting plates 53 of each grounding member 50 resiliently abut against the corresponding side plates 502 of the storage rack 500 for damping the shock to the second storage device 300. The second storage device 300 is effectively grounded to the storage rack 500 through the grounding members 50.

Even though numerous characteristics and advantages of the embodiments have been set forth in the foregoing description, together with details of the structure and function of the embodiments, the present disclosure is illustrative only, and changes may be made in details, including in the matters of shape, size, and arrangement of parts within the principles of the embodiments to the full extent indicated by the broad general meaning of the terms in which the appended claims are expressed.

What is claimed is:

1. A mounting apparatus for selectively mounting a first storage device or a second storage device in a storage rack, the mounting apparatus comprising:
   a supporting frame made of a resilient material, and comprising two side brackets;
   wherein each side bracket comprises a sidewall, an upper wall, a lower wall opposite to the upper wall, and a deformable abutting member formed at the upper wall, the lower walls and the upper walls of the side brackets are capable of sandwiching two opposite portions of the first storage device; and
   wherein when the abutting members are bent below the corresponding upper walls, the lower walls and the abutting members of the side brackets are capable of sandwiching two opposite portions of the second storage device.

2. The mounting apparatus of claim 1, wherein the supporting frame is made of plastic or nylon.

3. The mounting apparatus of claim 1, wherein each abutting member comprises a resilient coupling piece extending from the upper wall away from the sidewall, an abutting block extending from a distal end of the coupling piece, and a latching block protruding from a distal end of the abutting block, the sidewall of each side bracket defines a latching hole, when the abutting members are bent below the upper walls, the latching blocks are latched in the latching holes.

4. The mounting apparatus of claim 1, wherein the supporting frame further comprises a handle connected between the side brackets.

5. The mounting apparatus of claim 4, wherein the handle comprises a grip and two connection portions extending from opposite ends of the grip and connected to the corresponding side brackets, each connection portion defines a locking hole for engaging with a protrusion formed on the storage rack.

6. The mounting apparatus of claim 4, wherein at least one abutting piece is formed on the handle to abut against a front end of the first storage device or the second storage device to keep an angle between the handle and each of the side brackets greater than 90 degrees.

7. The mounting apparatus of claim 1, further comprising two grounding members made of resilient and conducting material, each grounding member comprises a mounting plate mounted in the corresponding side bracket, two substantially arc-shaped abutting plates extending from two opposite ends of the mounting plate to extending through the corresponding side brackets, and two substantially arc-shaped connecting pieces extending from opposite ends of the mounting plate away from the abutting plates, when the mounting apparatus is installed in the storage rack, the abutting plates abut against the storage rack, and the connecting pieces abut against the first storage device or the second storage device mounted in the mounting apparatus.

8. The mounting apparatus of claim 7, wherein each grounding member further comprises two positioning plates extending out from distal ends of the abutting plates, each upper wall defines two cutouts away from the sidewall, each positioning plate comprises a connecting portion extending from the distal end of the abutting plate toward the corresponding connecting piece, and a position portion extending from a distal end of the connecting portion, the position portions are received in the corresponding cutouts, for engaging with a top surface of the first storage device.

9. The mounting apparatus of claim 7, wherein an inner side of each sidewall defines two positioning holes, two resilient tongues extend from the mounting plate of each grounding member, a protrusion extends out from a distal end of each tongue, to latch in the corresponding position hole of the side bracket.

10. The mounting apparatus of claim 9, wherein two pairs of latching pieces are formed in the inner side of each sidewall, the latching pieces are parallel to the sidewall, the latching pieces and the sidewall of each side bracket cooperatively bound a mounting slot, the mounting plate of each grounding member is latched in the corresponding mounting slot.

11. The mounting apparatus of claim 7, wherein two ends of the sidewall of each side bracket define two through holes, the abutting plates of each grounding member extend through the corresponding through holes to abut against the storage rack.

12. The mounting apparatus of claim 1, wherein each side bracket further comprises two end walls extending from opposite ends of the sidewall and connected between the upper and lower walls, a distance between inside surfaces of the end walls of each side bracket is slightly less than a length of the first storage device and a length of the second storage device.

13. An assembly for selectively mounting a first storage device or a second storage device thinner than the first storage device, the assembly comprising:
   a mounting apparatus comprising a supporting frame and two grounding members made of resilient and conducting material, wherein the supporting frame comprises two side brackets; and
   a storage rack configured for receiving the mounting apparatus;
   wherein each side bracket comprises a sidewall, an upper wall, a lower wall opposite to the upper wall, and a deformable abutting member formed at the upper wall, the lower walls and the upper walls of the side brackets are capable of sandwiching two opposite portions of the first storage device;

wherein when the abutting members are bent below the upper walls, the lower walls and the abutting members of the side brackets are capable of sandwiching two opposite portions of the second storage device; and wherein each grounding member comprises a mounting plate mounted in the corresponding side bracket, two abutting plates extending out from two opposite ends of the mounting plate to expose out of the corresponding side bracket to abut against the storage rack, and two connecting pieces extending from the opposite ends of the mounting plate for abutting against the first storage device or the second storage device mounted in the mounting apparatus.

14. The assembly of claim 13, wherein each abutting member comprises a resilient coupling piece extending from the upper wall, an abutting block extending from a distal end of the coupling piece, and a latching block protruding from a distal end of the abutting block opposite to the coupling piece, the sidewall of each side bracket defines a latching hole, when the abutting members are bent below the upper walls, the latching blocks are latched in the latching holes.

15. The assembly of claim 13, wherein the supporting frame further comprises a handle connected between the side brackets, junctions between the handle and the side brackets are pliable, the storage rack comprises two locking portions to lock the handle of the supporting frame.

* * * * *